United States Patent
Jeong et al.

(10) Patent No.: US 9,935,245 B2
(45) Date of Patent: *Apr. 3, 2018

(54) SEMICONDUCTOR LIGHT-EMITTING DEVICE AND METHOD FOR FABRICATING THE SAME

(71) Applicant: LG INNOTEK CO., LTD., Seoul (KR)

(72) Inventors: Hwan Hee Jeong, Ulsan (KR); Sang Youl Lee, Jeonju-si (KR); June O Song, Yongin-si (KR); Tchang Hun Oh, Seoul (KR); Hee Seok Choi, Seoul (KR); Kwang Ki Choi, Gwangsan-gu (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/433,167

(22) Filed: Feb. 15, 2017

(65) Prior Publication Data

US 2017/0162753 A1 Jun. 8, 2017

Related U.S. Application Data

(63) Continuation of application No. 14/797,262, filed on Jul. 13, 2015, now Pat. No. 9,608,169, which is a
(Continued)

(30) Foreign Application Priority Data

Oct. 15, 2009 (KR) .................. 10-2009-0098361

(51) Int. Cl.
*H01L 33/44* (2010.01)
*H01L 33/22* (2010.01)
(Continued)

(52) U.S. Cl.
CPC .......... *H01L 33/44* (2013.01); *H01L 33/0075* (2013.01); *H01L 33/145* (2013.01);
(Continued)

(58) Field of Classification Search
CPC ......... H01L 29/7869; H01L 2924/0002; H01L 2924/00; H01L 2224/48091; H01L 27/1225; H01L 29/78696
See application file for complete search history.

(56) References Cited

U.S. PATENT DOCUMENTS

| 6,744,071 B2 | 6/2004 | Sano et al. |
| 6,946,683 B2 | 9/2005 | Sano et al. |

(Continued)

FOREIGN PATENT DOCUMENTS

| CN | 1613156 A | 5/2005 |
| CN | 101183699 | 5/2008 |

(Continued)

OTHER PUBLICATIONS

F. Braud et al:"Ti-diffusion barrier in Cu-based metallization", Applied surface science, vol. 91, No. 1-4, Oct. 1, 1995, pp. 251-256, XP055094525, ISSN:0169-4332(95)00127-1.
(Continued)

*Primary Examiner* — Tony Tran
(74) *Attorney, Agent, or Firm* — Ked & Associates LLP

(57) ABSTRACT

A semiconductor light-emitting device is provided. The semiconductor light-emitting device may include a light-emitting structure, an electrode, an ohmic layer, an electrode layer, an adhesion layer, and a channel layer. The light-emitting structure include a compound semiconductor layer. The electrode may be disposed on the light-emitting structure. The ohmic layer may be disposed under the light-emitting structure. The electrode layer may include a reflective metal under the ohmic layer. The adhesion layer may be
(Continued)

disposed under the electrode layer. The channel layer may be disposed along a bottom edge of the light-emitting structure.

19 Claims, 19 Drawing Sheets

Related U.S. Application Data continuation of application No. 13/862,784, filed on Apr. 15, 2013, now Pat. No. 9,117,971, which is a continuation of application No. 12/793,770, filed on Jun. 4, 2010, now Pat. No. 8,421,105.

(51) Int. Cl.
| | |
|---|---|
| H01L 33/38 | (2010.01) |
| H01L 33/14 | (2010.01) |
| H01L 33/00 | (2010.01) |
| H01L 33/32 | (2010.01) |

(52) U.S. Cl.
CPC ............. *H01L 33/22* (2013.01); *H01L 33/38* (2013.01); *H01L 33/32* (2013.01)

(56) References Cited

U.S. PATENT DOCUMENTS

| | | | |
|---|---|---|---|
| 7,368,329 | B2 | 5/2008 | Waitl et al. |
| 7,372,078 | B2 | 5/2008 | Jang et al. |
| 7,405,431 | B2 | 7/2008 | Aoyagi |
| 7,755,095 | B2 | 7/2010 | Nagai |
| 7,829,911 | B2 | 11/2010 | Unno |
| 8,004,006 | B2 | 8/2011 | Nakahara et al. |
| 8,097,478 | B2 | 1/2012 | Hodota |
| 8,274,094 | B2 | 9/2012 | Lee |
| 2003/0141506 | A1 | 7/2003 | Sano et al. |
| 2003/0209720 | A1 | 11/2003 | Okazaki et al. |
| 2004/0016934 | A1 | 1/2004 | Murakami et al. |
| 2005/0199885 | A1 | 9/2005 | Hata et al. |
| 2005/0211993 | A1 | 9/2005 | Sano et al. |
| 2006/0065901 | A1 | 3/2006 | Aoyagi et al. |
| 2006/0081869 | A1 | 4/2006 | Lu et al. |
| 2006/0097270 | A1 | 5/2006 | Yuri |
| 2006/0163599 | A1 | 7/2006 | Tsai et al. |
| 2007/0096116 | A1 | 5/2007 | Yasuda et al. |
| 2007/0108457 | A1 | 5/2007 | Lai et al. |
| 2007/0114545 | A1 | 5/2007 | Jang et al. |
| 2007/0141753 | A1 | 6/2007 | Uemura et al. |
| 2007/0290215 | A1 | 12/2007 | Kato et al. |
| 2008/0006836 | A1 | 1/2008 | Lee |
| 2008/0035949 | A1 | 2/2008 | Fudeta et al. |
| 2008/0135859 | A1 | 6/2008 | Cho et al. |
| 2008/0145962 | A1 | 6/2008 | Song et al. |
| 2008/0258174 | A1 | 10/2008 | Seong |
| 2009/0050916 | A1 | 2/2009 | Katsuno et al. |
| 2009/0141502 | A1 | 6/2009 | Sonoda et al. |
| 2009/0173952 | A1 | 7/2009 | Takeuchi et al. |
| 2009/0283793 | A1 | 11/2009 | Osawa et al. |
| 2010/0012969 | A1 | 1/2010 | Yoon et al. |
| 2010/0133505 | A1 | 6/2010 | Takao et al. |
| 2010/0224892 | A1 | 9/2010 | Nakahara |
| 2010/0230705 | A1 | 9/2010 | Jeong |
| 2010/0264440 | A1 | 10/2010 | Park |
| 2011/0001120 | A1 | 1/2011 | Jiang et al. |

FOREIGN PATENT DOCUMENTS

| | | |
|---|---|---|
| EP | 1 928 031 | 6/2008 |
| EP | 2063468 | 5/2009 |
| EP | 2 216 833 | 8/2010 |
| EP | 2 228 838 | 9/2010 |
| EP | 2 312 655 | 4/2011 |
| JP | 6-13343 | 1/1994 |
| JP | 9-167856 | 6/1997 |
| JP | 2000-174345 | 6/2000 |
| JP | 2004-193338 | 7/2004 |
| JP | 2004-281863 A | 10/2004 |
| JP | 2005-033197 | 2/2005 |
| JP | 2006-100500 A | 4/2006 |
| JP | 2006-140297 A | 6/2006 |
| JP | 2006-173386 | 6/2006 |
| JP | 2006-216816 | 8/2006 |
| JP | 2007-134415 | 5/2007 |
| JP | 2007-142368 | 6/2007 |
| JP | 2007-150310 | 6/2007 |
| JP | 2007-158132 A | 6/2007 |
| JP | 2007-517378 | 6/2007 |
| JP | 2007-200995 A | 8/2007 |
| JP | 2007-258326 | 10/2007 |
| JP | 2008-518436 | 5/2008 |
| JP | 2008-277342 | 11/2008 |
| JP | 2008-294482 | 12/2008 |
| JP | 2009-49266 A | 3/2009 |
| JP | 2009-188240 A | 8/2009 |
| JP | 2009-212357 | 9/2009 |
| JP | 2011-86907 | 4/2011 |
| KR | 10-2004-0010419 | 1/2004 |
| KR | 10-2006-0035424 A | 4/2006 |
| KR | 10-2006-0048707 | 5/2006 |
| KR | 10-2006-0054089 | 5/2006 |
| KR | 10-2008-0030106 | 4/2008 |
| KR | 10-2008-0061693 | 7/2008 |
| KR | 10-2008-0061697 | 7/2008 |
| KR | 10-2009-0015633 | 2/2009 |
| KR | 10-2009-0054008 A | 5/2009 |
| KR | 10-2009-0104931 | 10/2009 |
| WO | WO 03/065464 | 8/2003 |
| WO | WO 2006/043796 | 4/2006 |
| WO | WO 2008/152988 | 12/2008 |
| WO | WO 2009/002040 A2 | 12/2008 |
| WO | WO 2009/004980 | 1/2009 |
| WO | WO 2009/045082 | 4/2009 |
| WO | WO 2009/117845 A1 | 10/2009 |

OTHER PUBLICATIONS

European Search Report dated Sep. 20, 2010 (Application No. 10165714.6-1226).
European Search Report dated Nov. 25, 2010 issued in Application No. 10 16 6248.
Korean Office Action dated Jan. 7, 2011 issued in Application No. 10-2009-0098355.
U.S. Office Action issued in U.S. Appl. No. 12/793,770 dated Jul. 6, 2011.
U.S. Office Action issued in U.S. Appl. No. 12/796,044 dated Jul. 22, 2011.
U.S. Office Action issued to U.S. Appl. No. 12/793,770 dated Nov. 17, 2011.
U.S. Office Action issued in U.S. Appl. No. 12/796,044 dated Jan. 11, 2012.
U.S. Office Action issued in U.S. Appl. No. 12/797,927 dated May 31, 2012.
Chinese Office Action dated Aug. 10, 2012.
U.S. Office Action issued in U.S. Appl. No. 12/797,927 dated Nov. 1, 2011.
Search Report dated Nov. 23, 2012.
Office Action dated Feb. 26, 2013.
Japanese Office Action dated Apr. 23, 2013.
U.S. Office Action issued in U.S. Appl. No. 12/797,927 dated Aug. 2, 2013.
Japanese Office Action dated Nov. 12, 2013.
European Search Report dated Jan. 8, 2014.
Chinese Office Action dated Jun. 18, 2014 issued in Application No. 210110202949.1.
Japanese Office Action dated Oct. 15, 2014, issued in Application No. L0014-1394.
Taiwan Examination Report dated Jan. 19, 2015.
U.S. Notice of Allowance issued in U.S. Appl. No. 13/862,784 dated Apr. 13, 2015.

(56) References Cited

OTHER PUBLICATIONS

U.S. Office Action issued in U.S. Appl. No. 14/797,262 dated Mar. 16, 2016.
Japanese Office Action dated Mar. 28, 2016 issued in Application No. 2015-098430.
U.S. Office Action issued in U.S. Appl. No. 14/797,262 dated Jul. 26, 2016.
U.S. Notice of Allowance issued in U.S. Appl. No. 14/797,262 dated Nov. 10, 2016.
Japanese Office Action dated Jan. 9, 2018.

US 9,935,245 B2

SEMICONDUCTOR LIGHT-EMITTING DEVICE AND METHOD FOR FABRICATING THE SAME

CROSS-REFERENCE TO RELATED APPLICATIONS

The present application is a Continuation of application Ser. No. 14/797,262 filed Jul. 13, 2015, which is a Continuation of U.S. patent application Ser. No. 13/862,784 filed on Apr. 15, 2013, now U.S. Pat. No. 9,117,971, which is a Continuation of U.S. patent application Ser. No. 12/793,770 filed on Jun. 4, 2010, now U.S. Pat. No. 8,421,105, which claims the benefit under 35 U.S.C. §119 of Korean Patent Application No. 10-2009-0098361, filed in Korea on Oct. 15, 2009, which are hereby incorporated in their entirety by reference as if fully set forth herein.

BACKGROUND

1. Field

A semiconductor light-emitting device and a method for fabricating the same are disclosed herein.

2. Background

Semiconductor light-emitting devices and methods for fabricating the same are known. However, they suffer from various disadvantages.

BRIEF DESCRIPTION OF THE DRAWINGS

Embodiments will be described in detail with reference to the following drawings in which like reference numerals refer to like elements, and wherein.

DETAILED DESCRIPTION

Figure 1:
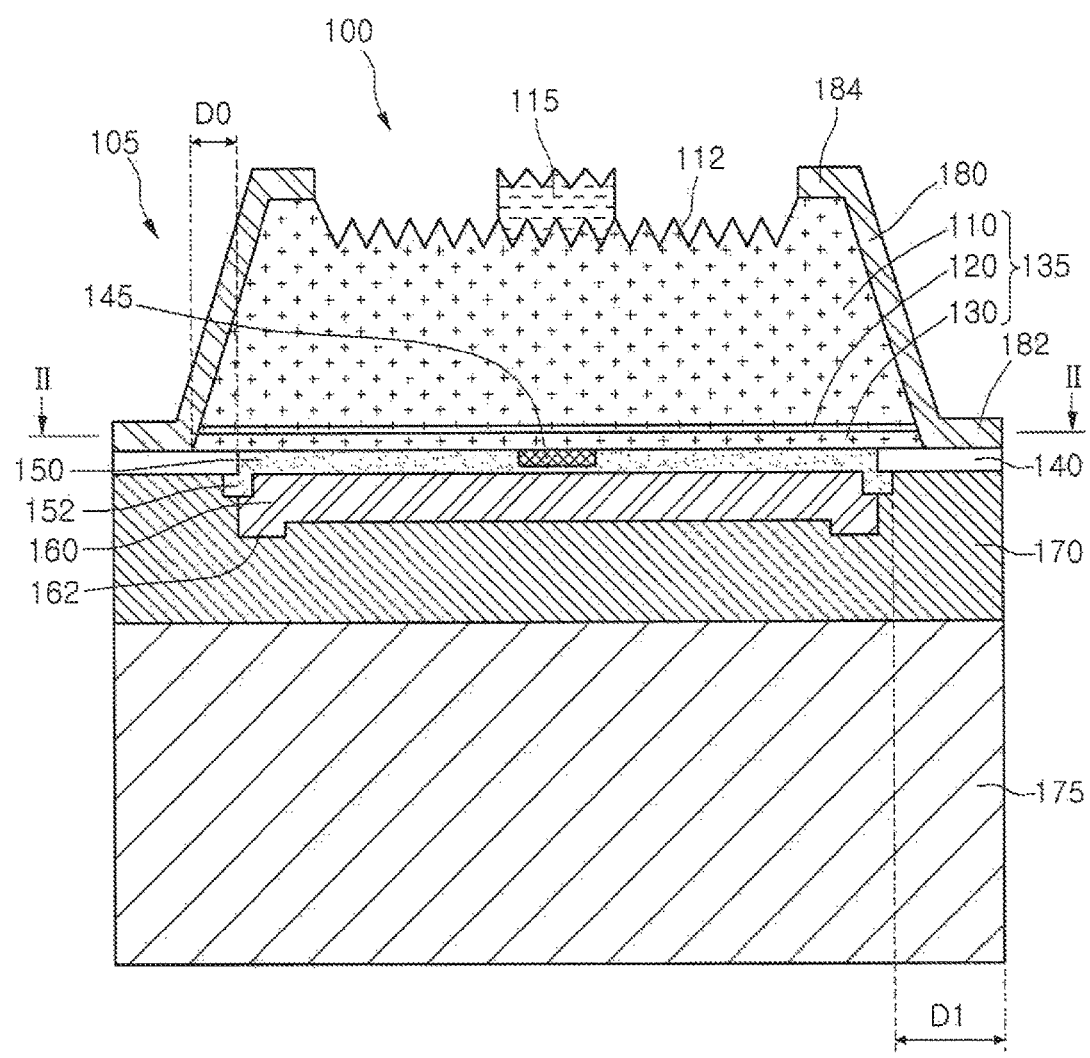
FIG. 1 is a sectional view of a semiconductor light-emitting device according to an embodiment.

Reference will now be made in detail to embodiments, examples of which are illustrated in the accompanying drawings. Where possible, like reference numerals have been used to indicate like elements.

In the descriptions of embodiments, it should be understood that when a layer (or film), a region, a pattern, or a structure is referred to as being "on/under" a substrate, a layer (or film), a region, a pad, or patterns, it may be directly on the substrate, the layer (or film), the region, the pad, or the patterns, or intervening layers may also be present. Further, the reference about 'on' and 'under' each layer will be made on the basis of the drawings. In the drawings, dimensions of each of the elements may be exaggerated for clarity of illustration, and the dimensions of each of the elements may be different from the actual dimension of each of the elements.

Due to their physical and chemical characteristics, Group III-V nitride semiconductors are being used as core materials for light-emitting devices, such as light-emitting diodes (LEDs) and laser diodes (LDs). An example of the Group III-V nitride semiconductors is a nitride semiconductor with a composition equation of $In_xAl_yGa_{1-x-y}N$ ($0 \leq x \leq 1$, $0 \leq y \leq 1$, $0 \leq x+y \leq 1$).

An LED is a kind of semiconductor device that is used as a light source or uses the characteristics of compound semiconductors to converts electricity into light to exchange signals. Nitride semiconductor based LEDs or LDs are widely used in light-emitting devices, and are applied as light sources for various products, such as keypad light-emitting units of mobile phones, electric light panels, and illumination devices.

Figure 2:
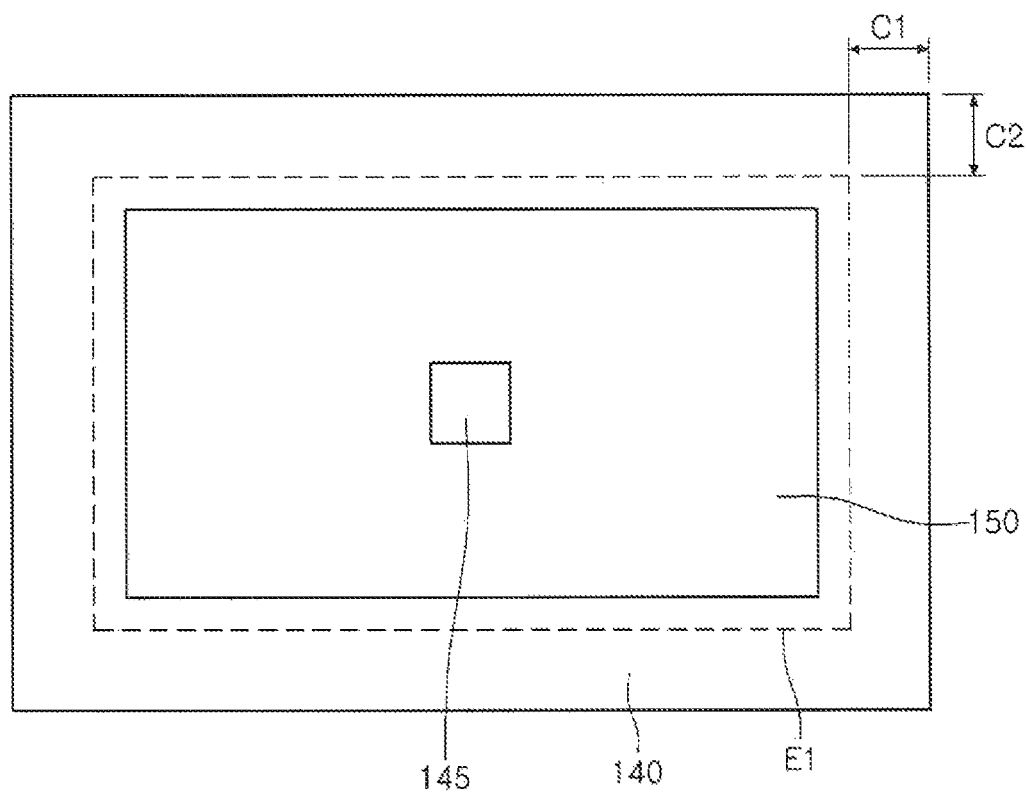
FIG. 2 is a sectional view of the semiconductor light-emitting device of FIG. 1 taken along a line II-II.

FIG. 1 is a sectional view of a semiconductor light-emitting device according to an embodiment. FIG. 2 is a sectional view of the semiconductor light-emitting device of FIG. 1 taken along line II-II.

Referring to FIGS. 1 and 2, a semiconductor light-emitting device 100 may include a light-emitting structure 135, a channel layer 140, an ohmic layer 150, an electrode layer 160, an adhesion layer 170, and a conductive support member 175.

The semiconductor light-emitting device 100 may be formed using a compound semiconductor, for example, a Group III-V compound semiconductor. The semiconductor light-emitting device 100 may emit light of a visible-ray region, such as blue, green, and red light, and may emit light of an ultraviolet region. The semiconductor light-emitting device 100 may vary in shape and structure within the technical scope of embodiments.

The light-emitting structure 135 may include a first conductivity type semiconductor layer 110, an active layer 120, and a second conductivity type semiconductor layer 130. The first conductivity type semiconductor layer 110 may be formed using, for example, a Group III-V compound semiconductor doped with a first conductivity type dopant. For example, the Group III-V compound semiconductor may include at least one selected from the group consisting of GaN, AlN, AlGaN, InGaN, InN, InAlGaN, AlInN, AlGaAs, GaP, GaAs, GaAsP, and AlGaInP. For example, if the first conductivity type semiconductor layer 110 is formed of an N type semiconductor, the first conductivity type dopant may be selected from the Group V elements. The first conductivity type semiconductor layer 110 may be formed to have a single-layer or multi-layer structure; however, embodiments are not limited thereto.

An electrode 115 may be disposed on the first conductivity type semiconductor layer 110. The electrode 115 may branch in a pattern shape; however, embodiments are not limited thereto. A top surface of the first conductivity type semiconductor layer 110 may be formed to have a roughness pattern 112 to improve light extraction efficiency. Further, a top surface of the electrode 115 may be formed to have a roughness pattern as well; however, embodiments are not limited thereto.

The active layer 120 may be disposed under the first conductivity type semiconductor layer 110. The active layer 120 may be formed to have, for example, a single or multi quantum well structure. The active layer 120 may be formed of, for example, a Group III-V compound semiconductor to have a period of a well layer and a barrier layer. For example, the active layer 120 may be formed to have an InGaN well layer/a GaN barrier layer or an InGaN well layer/an ALGaN barrier layer.

A conductive clad layer (not shown) may be formed on and/or under the active layer 120. For example, the conductive clad layer may be formed of an AlGaN-based semiconductor.

The second conductivity type semiconductor layer 130 may be disposed under the active layer 120. The second conductivity type semiconductor layer 130 may be formed using, for example, a Group III-V compound semiconductor doped with a second conductivity type dopant. For example, the Group III-V compound semiconductor may include at least one selected from the group consisting of GaN, AlN, AlGaN, InGaN, InN, InAlGaN, AlInN, AlGaAs, GaP, GaAs, GaAsP, and AlGaInP. For example, if the second conductivity type semiconductor layer 110 is formed of a P type semiconductor, the second conductivity type dopant may be selected from the Group III elements. The second conductivity type semiconductor layer 130 may be formed to have, for example, a single-layer or multi-layer structure; however, embodiments are not limited thereto.

Figure 1A:
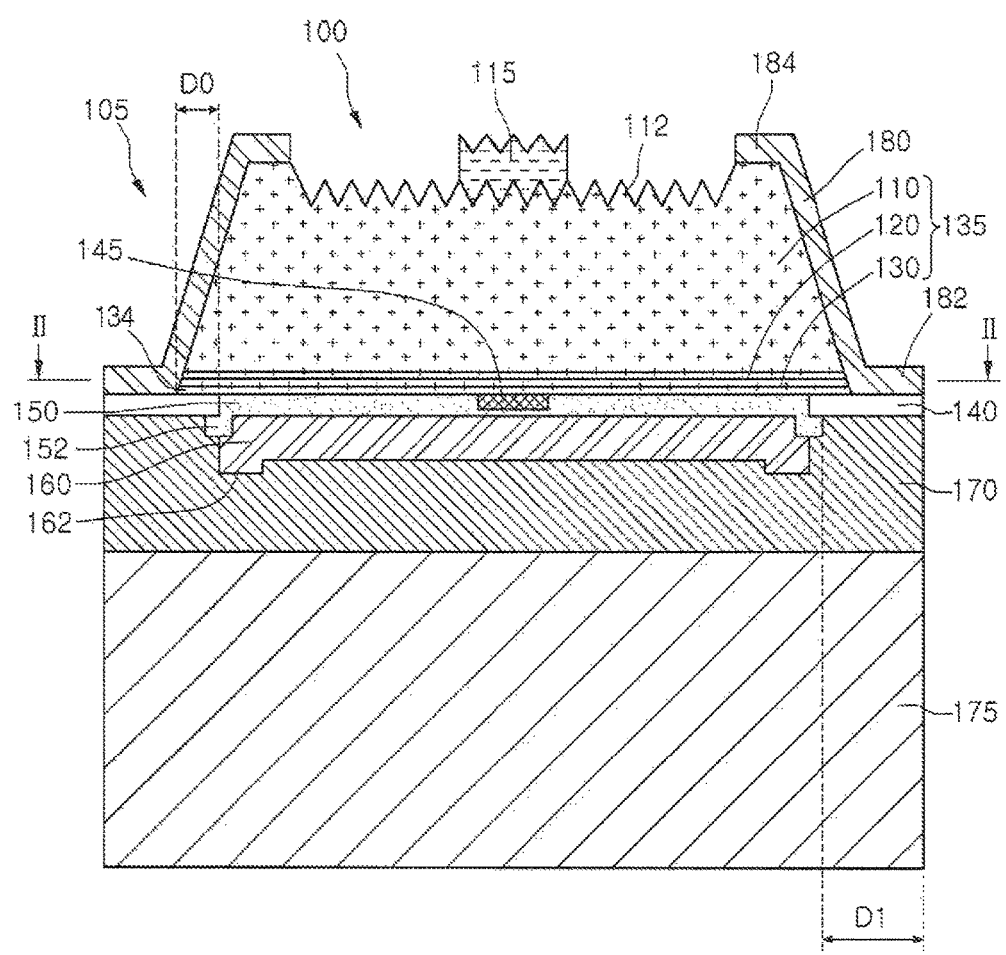
FIG. 1A is a sectional view of a semiconductor light-emitting device according to another embodiment.

The light-emitting structure 135 may further include a third conductivity type semiconductor layer 134, which may be of the first conductivity type, disposed under the second conductivity type semiconductor layer 130, as shown in FIG. 1A. The third conductivity type semiconductor layer may be opposite in polarity to the second conductivity type semiconductor layer 130. Also, the first conductivity type semiconductor layer 110 may be a P-type semiconductor layer, and the second conductivity type semiconductor layer 130 may be an N-type semiconductor layer. Accordingly, the light-emitting structure 135 may include at least one of an N-P junction structure, a P-N junction structure, an N-P-N junction structure, or a P-N-P junction structure.

The channel layer 140 and the ohmic layer 150 may be disposed under the second conductivity type semiconductor layer 130 or the third conductivity type semiconductor layer 134. Hereinafter, for convenience in description, it s assumed that the second conductivity type semiconductor layer 130 is disposed as a lowermost layer of the light-emitting structure 135.

The channel layer 140 may be formed along outer edges of the second conductivity type semiconductor layer 130 and the adhesion layer 170. Herein, an edge region 105 of the light-emitting structure 135 is a channel region where the channel layer 140 and/or an insulating layer 180 may be exposed.

An inner region D0 of the channel layer 140 may contact a bottom edge of the second conductivity type semiconductor layer 130, and an outer portion of the channel layer 140 may extend to an outside wall or edge of the light-emitting structure 135. The channel layer 140 may be formed, for example, in a loop, ring, or frame shape along a bottom edge of the second conductivity type semiconductor layer 130. The channel layer 140 may be formed in a closed-loop shape.

The channel layer 140 may be formed, for example of at least one of oxide, nitride or an insulating material. For example, the channel layer 140 may be formed of at least one selected from the group consisting of ITO (indium tin oxide), IZO (indium zinc oxide), ZTO (indium zinc tin oxide), IAZO (indium aluminum zinc oxide), IGZO (indium gallium zinc oxide) IGTO (indium gallium tin oxide), AZO (aluminum zinc oxide), ATO (antimony tin oxide), GZO (gallium zinc oxide), $SiO_2$, $SiO_x$, $SiO_xN_y$, $Si_3N_4$, $Al_2O_3$, and $TiO_2$.

The channel layer 140 may prevent the occurrence of an electrical short even when the outer wall of the light-emitting structure 135 is exposed to moisture, thus making the semiconductor light-emitting device robust against high humidity. When the channel layer 140 is formed of a transparent material, irradiated laser beams may be transmitted in a laser scribing process, thereby preventing a metal material from being fragmented due to laser irradiation. Accordingly, an interlayer short in sidewalls of the light-emitting structure 135 may be prevented.

The channel layer 140 may provide a predetermined interval between the adhesion layer 170 and an outer wall of each layer 110/120/130 of the light-emitting structure 135.

The ohmic layer 150 may be disposed inside the channel layer 130 and under the second conductivity type semiconductor layer 130. The ohmic layer 150 may ohmic-contact the second conductivity type semiconductor layer 130. For example, the ohmic layer 150 may be embodied in ITO, IZO, IZTO, IAZO, IGZO, IGTO, AZO, or ATO. That is, the ohmic layer 150 may selectively use a conductive oxide and a metal. For example, the ohmic layer 150 may be formed in, for example, a single-layer or multi-layer structure using at least one of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IrOx, RuOx, RuOx/ITO, Ni, Ag, Ni/IrOx/Au, or Ni/IrOx/Au/ITO.

An end portion 152 of the ohmic layer 150 may contact an inner bottom of the channel layer 140. The end portion 152 of the ohmic layer 150 may not be exposed outside of the chip by being spaced apart from the outer wall of the adhesion layer 170 by a predetermined distance D1. Accordingly, exfoliation in the interface between the ohmic layer 150 and other layers may be prevented. Also, the end portion 152 of the ohmic layer 150 may be formed as a cover type under an inner end of the channel layer 140, thereby protecting the inner end (inner surface) of the channel layer 140.

Also, a current blocking layer 145 may be disposed under the second conductivity type semiconductor layer 130. The current blocking layer 145 may be formed in the ohmic layer 150, between the ohmic layer 150 and the second conductivity type semiconductor layer 130, or between the electrode layer 160 and the ohmic layer 150.

The current blocking layer 145 may be formed to have a lower electrical conductivity than the electrode layer 160 or the adhesion layer 170. For example, the current blocking layer 145 may be formed of at least one of ITO, IZO, IZTO, IAZO, IGZO, IGTO, AZO, ATO, ZnO, $SiO_2$, $SiO_x$, $SiO_xN_y$, $Si_3N_4$, $Al_2O_3$, or $TiO_2$. If the electrode layer 160 is formed of Ag, the current blocking layer 145 may be formed, or example, of ITO, ZnO, or $SiO_2$.

The current blocking layer 145 may be formed to correspond to a shape of the electrode 115. Also, the current blocking layer 145 may be formed in a region corresponding to the electrode 115. A size of the current blocking layer 145 may vary according to current distribution.

The electrode layer 160 may be disposed under the ohmic layer 150 to serve as a reflection layer. The electrode layer 160 may be formed of one selected from the group consisting of Ag, Ni, Al, Rh, Pd, Ir, Ru, Mg, Zn, Pt, Au, Hf, and a combination thereof. Also, the electrode layer 160 may be formed in a multi-layer structure using a metal material and a conductive oxide material, such as IZO, IZTO, IAZO, IGZO, IGTO, AZO, and ATO. For example, the electrode layer 160 may be formed, for example, of IZO/Ni, AZO/Ag, IZO/Ag/Ni, or AZO/Ag/Ni.

The electrode layer 160 may be formed under the ohmic layer 160, such that its end portion 162 does not contact the ohmic layer 150. Accordingly, the problem of a decrease in adhesive force due to contact between the oxide material (for example, ITO and SiO2) of the channel layer 140 and the metal (for example, Ag) of the electrode layer 160 may be reduced and chip reliability improved. The electrode layer 160 may reflect light incident from the light-emitting structure 135, thus increasing light extraction efficiency.

The adhesion layer 170 may be disposed under the electrode layer 160. The adhesion layer 170 may include a barrier metal or a bonding metal. For example, the adhesion layer 170 may include at least one of Ti, Au, Sn, Ni, Cr, Ga, In, Bi, Cu, Ag, or Ta.

The adhesion layer 170 may be disposed under the electrode layer 160 and the channel layer 140. The adhesion layer 170 may be exposed at an outer wall of the chip. The adhesion layer 170 may contact the electrode layer 160, the end portion 152 of the ohmic layer 150, and the channel layer 140 to increase adhesive force between the layers.

The conductive support member 175 may be disposed under the adhesion layer 170. The conductive support member 175 may be a base substrate formed using, for example, copper (Cu), aurum (Au), nickel (Ni), molybdenum (Mo), copper-tungsten (Cu—W), or a carrier wafer (for example, Si, Ge, GaAs, ZnO, SiC, GaN, and SiGe). The conductive support member 175 may also be formed, for example, using a conductive sheet.

An edge of the light-emitting structure 135 may be inclined. The insulating layer 180 may be formed along the edge of the light-emitting, structure 135. The insulating layer 180 may have a bottom portion 182 disposed on the channel layer 140 and a top portion 184 disposed around the first conductivity type semiconductor layer 110. Accordingly, adhesive force to the insulating layer 180 may be increased and interlayer short of the light-emitting structure 135 may be prevented.

Referring to FIG. 2, an inner portion of the channel layer 140 may be disposed in a semiconductor region E1. Also, an outer portion of the channel layer 140 may be disposed in regions C1 and C2 outside of the semiconductor region E1. The current blocking layer 146 may be disposed in an inner region of the ohmic layer 150, for example, in a region corresponding to the electrode 115 of FIG. 1.

Figure 3:
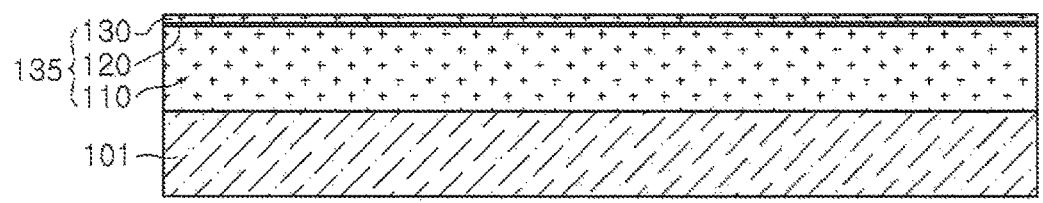
FIGS. 3 to 13 are sectional views illustrating a process for fabricating a semiconductor light-emitting device according to an embodiment.
Figure 4:
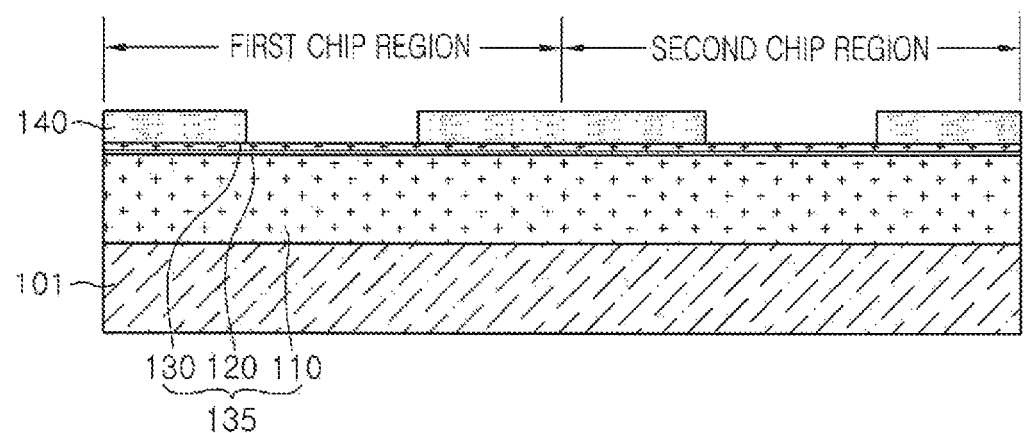

FIGS. 3 to 13 are sectional views illustrating a process for fabricating a semiconductor light-emitting device according to an embodiment. Referring to FIGS. 3 and 4, a substrate 101 may be loaded on growth equipment, and a Group II to VI compound semiconductor may be formed thereon in a layer or pattern shape. The growth equipment may be, for example, one of a PVD (physical vapor deposition) equipment, a CVD (chemical vapor deposition) equipment, a PLD (plasma laser deposition) equipment, a dual-type thermal evaporator, a sputtering equipment, or an MOCVD (metal organic chemical vapor deposition) equipment; however, embodiments are not limited thereto.

The substrate 101 may be formed, for example of at least one selected from the group consisting sapphire ($Al_2O_3$), GaN, SiC, ZnO, Si, GaP, InP, $Ga_2O_3$, conductive material, and GaAs. A roughness pattern may be formed in a top surface of the substrate 101. Also a layer or pattern based on a Group II to VI compound semiconductor, for example, at least one of an ZnO layer (not illustrated), a buffer layer (not illustrated) and an undoped semiconductor layer (not illustrated) may be formed on the substrate 101. The buffer layer or the undoped semiconductor layer may be formed using a group III-V compound semiconductor. The buffer layer may reduce a lattice constant with the substrate 101, and the undoped semiconductor layer may be formed, for example, of an undoped GaN-based semiconductor.

A first conductivity type semiconductor layer 110 may be formed on the substrate 101. An active layer 120 may be formed on the first conductivity type semiconductor layer 110. A second conductivity type semiconductor layer 130 may be formed on the active layer 120.

The first conductivity type semiconductor layer 110 may be formed using, for example, a Group III-V compound semiconductor doped with a first conductivity type dopant. For example, the Group III-V compound semiconductor may include at least one selected from the group consisting of GaN, AlN, AlGaN, InGaN, InN, InAlGaN, AlInN, AlGaAs, GaP, GaAs, GaAsP, and AlGaInP. For example, if the first conductivity type semiconductor layer 110 is formed of a N type semiconductor, the first conductivity type dopant may be selected from the Group V elements. The first conductivity type semiconductor layer 110 may be formed to have, for example, a single-layer or multi-layer structure; however, embodiments are not limited thereto.

The active layer 120 may be formed on the first conductivity type semiconductor layer 110. The active layer 120 may be formed to have, for example, a single or multi quantum well structure. The active layer 120 may be formed, for example, of a Group III-V compound semiconductor to have a period of a well layer and a barrier layer, for example, a period of an InGaN well layer/a GaN barrier layer or an InGaN well layer/an AlGaN barrier layer.

A conductive clad may be formed on and/or under the active layer 120. For example, the conductive clad layer may be formed of an AlGaN-based semiconductor.

The second conductivity type semiconductor layer 130 may be formed on the active layer 120. The second conductivity type semiconductor layer 130 may be formed using, for example, a Group III-V compound semiconductor doped with a second conductivity type dopant. For example, the Group III-V compound semiconductor may include at least one selected from the group consisting of GaN, AlN, AlGaN, InGaN, InN, InAlGaN, AlInN, AlGaAs, GaP, GaAs, GaAsP, and AlGaInP. For example, if the second conductivity type semiconductor layer 110 is formed of a P type semiconductor, the second conductivity type dopant may be selected from the Group III elements. The second conductivity type semiconductor layer 130 may be formed to have, for example, a single-layer or multi-layer structure; however, embodiments are not limited thereto.

The first conductivity type semiconductor layer 110, the active layer 120, and the second conductivity type semiconductor layer 130 may constitute a light-emitting structure 135. Also, a third conductivity type semiconductor layer 134, for example, a N-type semiconductor layer or a P-type semiconductor layer may be formed on the second conductivity type semiconductor layer 130. Accordingly, the light-emitting structure 135 may be formed to include at least one of a N-P junction structure, a P-N junction structure, a N-P-N junction structure, and a P-N-P junction structure.

A channel layer 140 may be formed in each chip boundary region (channel region). The channel layer 140 may be formed around each chip region by using, for example, a mask pattern. The channel layer 140 may be formed, for example, in a loop, ring or frame shape. The channel layer 140 may be formed, for example, of at least one of oxide, nitride, or an insulating material. For example, the channel layer 140 may be formed of at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium oxide), AZO (aluminum zinc oxide), ATO (antimony tin oxide), GZO (gallium zinc oxide), $SiO_2$, $SiO_x$, $SiO_xN_y$, $Si_3N_4$, $Al_2O_3$, and $TiO_2$. For example, the channel layer 140 may be formed, for example, by a sputtering process or a deposition process.

Figure 5:
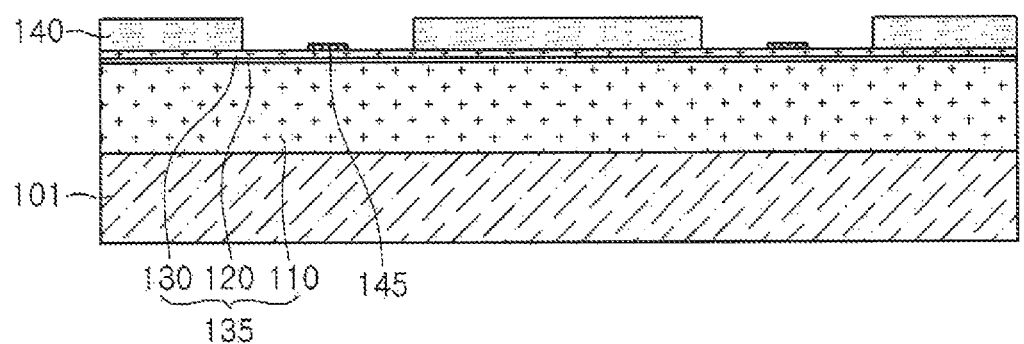

Referring to FIGS. 4 and 5, a current, blocking layer 145 may be formed on the second conductivity type semiconductor layer 130. The current blocking layer 145 may be formed using, for example, a mask pattern. The current blocking layer 145 may be formed of the same material as or a different material from the channel layer 140. The formation order may vary according to such a material difference.

The current blocking layer 145 may be formed to have a lower electrical conductivity than the second conductivity type semiconductor layer 130. For example, the current blocking layer 145 may be formed of at least one of ITO, IZO, IZTO, IAZO, IGZO, IGTO, AZO, ATO, ZnO, $SiO_2$, $SiO_x$, $SiO_xN_y$, $Si_3N_4$, $Al_2O_3$, or $TiO_2$. The current blocking layer 146 may be formed using, for example, a mask pattern. Further, the current blocking layer 145 may be formed to correspond to a region for an electrode. The current blocking layer 145 may be formed in a same shape as an electrode pattern; however, embodiments are not limited thereto.

Figure 6:
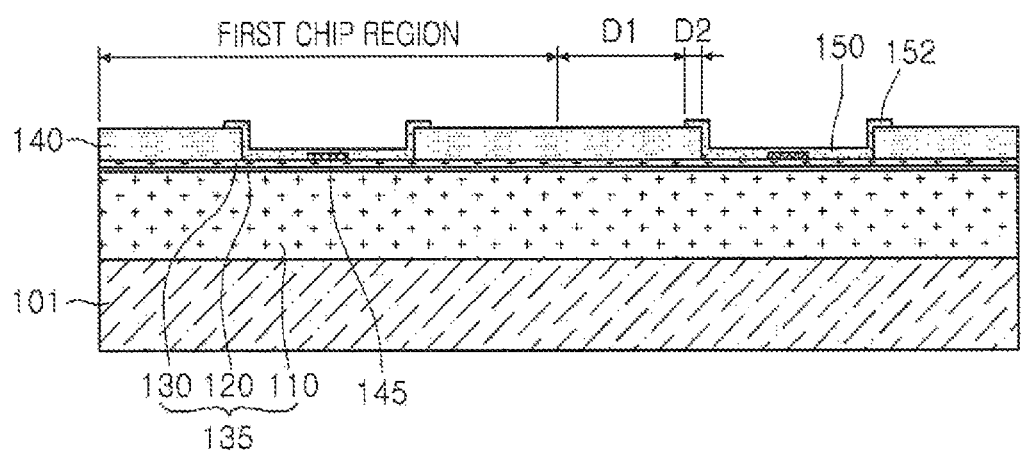

Referring to FIGS. 5 and 6, an ohmic layer 150 may be formed on the second conductivity type semiconductor layer 130 to ohmic-contact the second conductivity type semiconductor layer 130. The ohmic layer 150 may be formed on the second conductivity type semiconductor layer 130 and the current blocking layer 145 to reduce contact resistance. In comparison with adjacent regions, the current blocking layer 145 may have little current flowing therethrough, thus supplying a current in a diffused manner.

An end portion 152 of the ohmic layer 150 may be formed to overlap with the channel layer 140. In one chip region, the end portion 152 of the ohmic layer 150 may overlap an inner end of the channel layer 140 by a predetermined width D2, thereby protecting the inner end of the channel layer 140. The end portion 152 of the ohmic layer 150 may not be exposed outside of the chip by being spaced apart from the chip boundary or wall by a predetermined distance D1.

Figure 7:
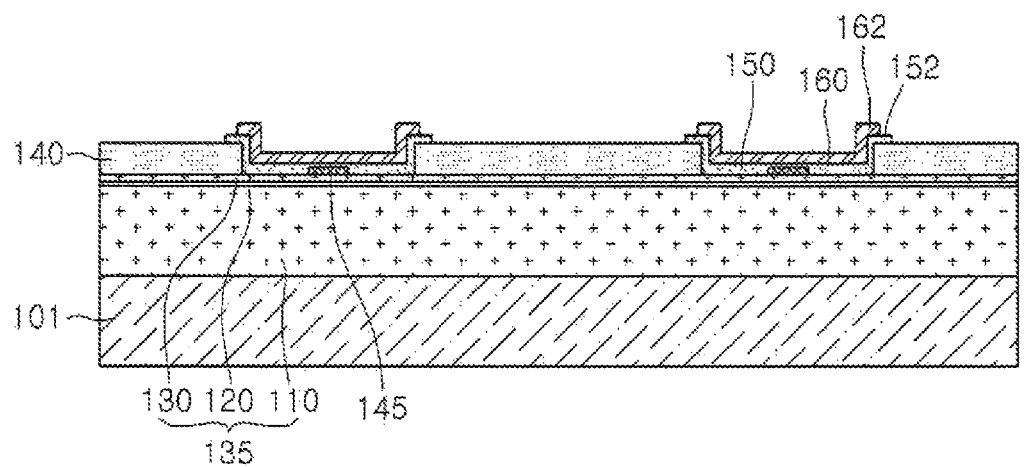

Referring to FIGS. 6 and 7, an electrode layer 60 may be formed on the ohmic layer 150. The electrode layer 160 may have a reflection function and may reflect incident light, thus improving light extraction efficiency. The electrode layer 160 may be formed, for example, of one selected from the group consisting of Ag, Ni, Al, Rh, Pd, Ir, Ru, Mg, Zn, Pt, Au, Hf, and a combination thereof. Also, the electrode layer 160 may be formed, for example, in a multi-layer structure using a metal material and a conductive oxide material, such as IZO, IZTO, IAZO, IGZO, IGTO, AZO, and ATO. For example, the electrode layer 160 may be formed of IZO/Ni, AZO/Ag, IZO/Ag/Ni, or AZO/Ag/Ni.

The electrode layer 160 may be formed on the ohmic layer 150, such that its end portion 162 does not contact the channel layer 140. Accordingly, the problem of a decrease in the adhesive force due to contact between the oxide material (for example, ITO and $SiO_2$) of the channel layer 140 and the metal (for example, Ag) of the electrode layer may be reduced, and chip reliability improved.

Figure 8:
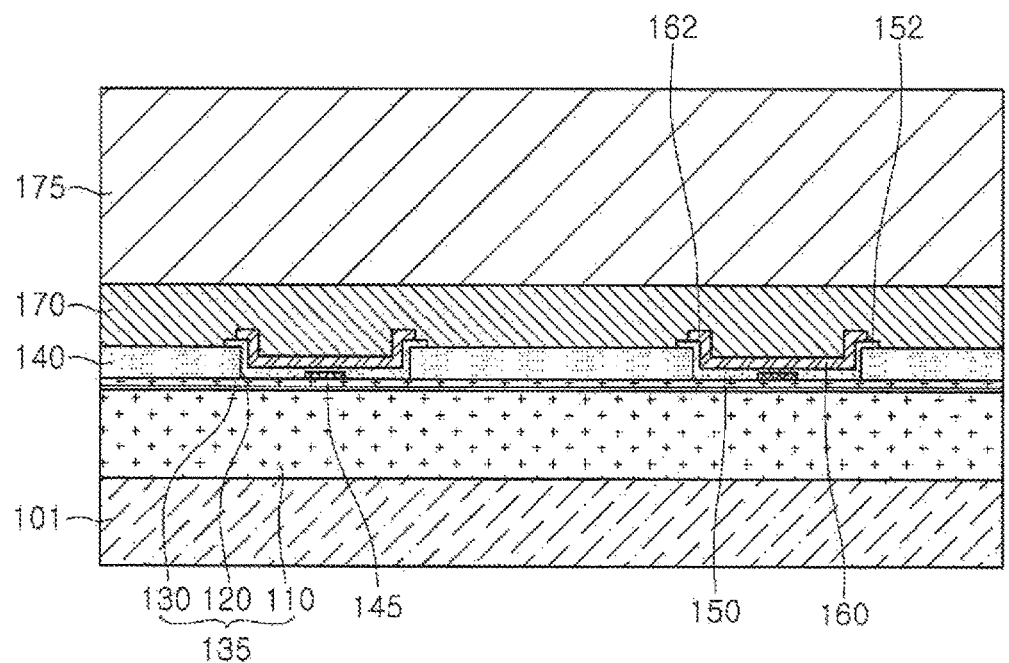

Referring to FIGS. 7 and 8, an adhesion layer 170 may be formed on the electrode layer 160. The adhesion layer 170 may include, for example, a barrier metal or a bonding metal. For example, the adhesion layer 170 may include at least one of Ti, Au, Sn, Ni, Cr, Ga, In, Cu, Ag, or Ta.

The adhesion layer 170 may be formed on the electrode layer 160 and the channel layer 140. The adhesion layer 170 may be formed in a chip boundary region. The adhesion layer 170 may contact the electrode layer 160, the end portion 152 of the ohmic layer 150, and the channel layer 140 to increase interlayer adhesive force.

A conductive support member 175 may be formed on the adhesion layer 170. The conductive support member 175 may be a base substrate formed using, for example, copper (Cu), aurum (Au), nickel (Ni), molybdenum (Mo), copper-tungsten (Cu—W), or a carrier wafer (for example Si, Ge, GaAs, ZnO, SiC, GaN, and SiGe). The conductive support member 175 may be, for example, bonded to the adhesion layer 170, may be formed of a plating layer, or may be attached in the shape of a conductive sheet.

Figure 9:
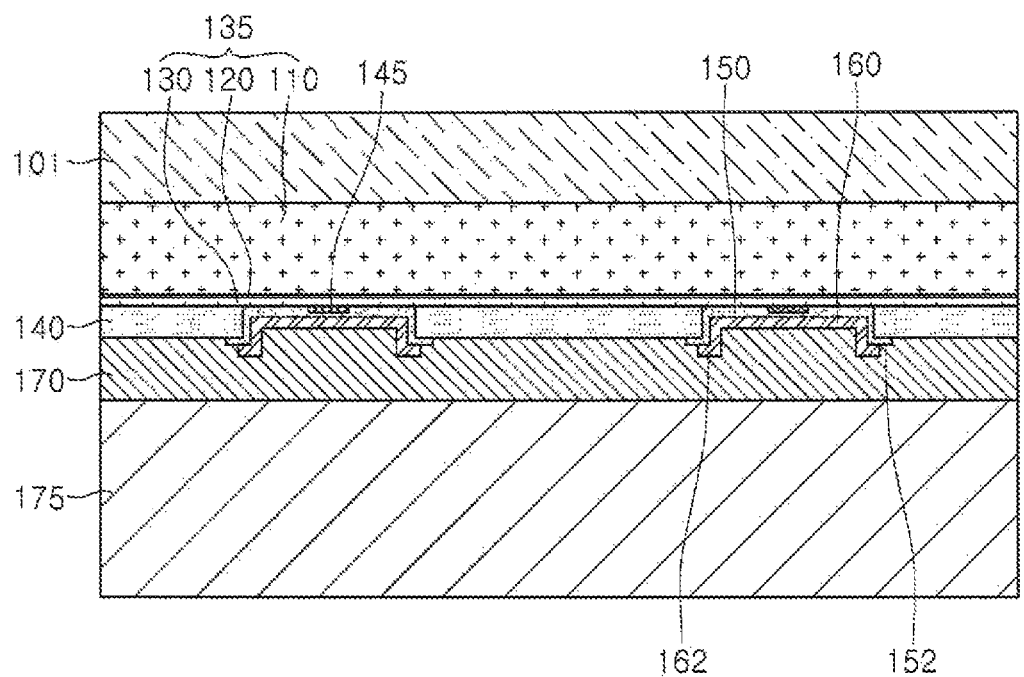
Figure 10:
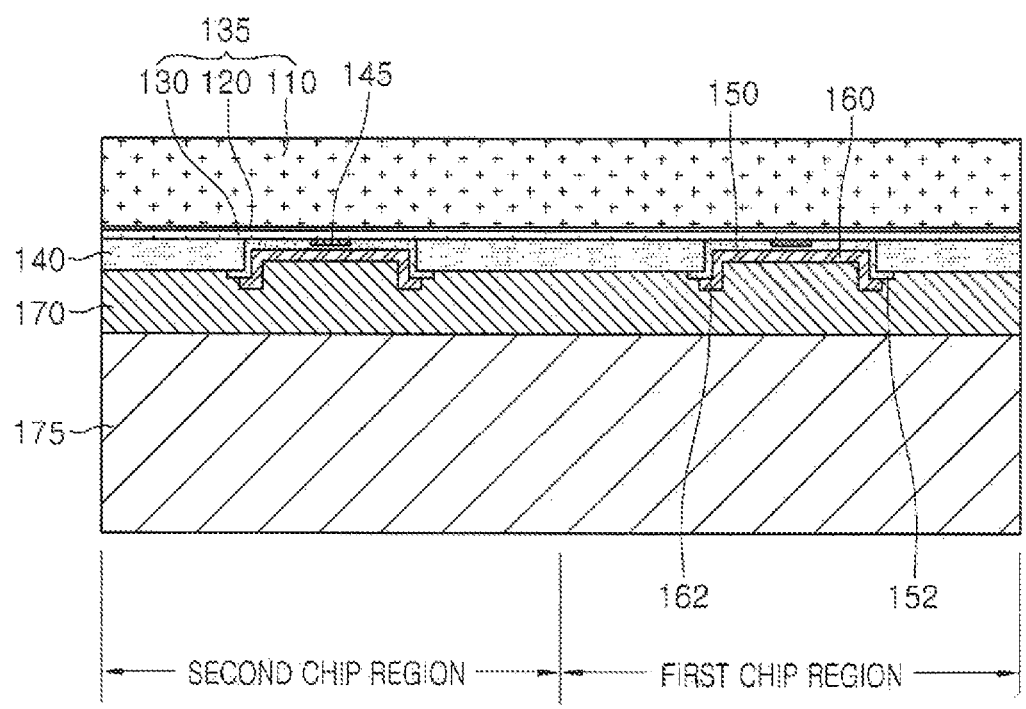

Referring to FIGS. 8 to 10, the conductive support member 175 become the base, and the substrate 101 removed. For example, the substrate 101 may be removed by, for example, a Laser Lift Off (LLO) process. The LLO process may irradiate a laser beam of a predetermined wavelength onto the substrate 101 to remove the substrate 101. If another semiconductor layer (for example, a buffer layer) or an air gap is present between the substrate 101 and the first conductivity type semiconductor layer 110, the substrate 101 may be removed using, for example, a wet etchant.

If the channel layer 140 is formed of transparent material, when the laser irradiates a laser beam to the interface between the substrate 101 and the semiconductor layer or the interface between the two semiconductor layers, the irradiated laser beam may penetrate the channel layer 140, thereby preventing metal fragments from being generated in the channel region due to laser irradiation and preventing an outer wall of each layer of the light-emitting structure 135.

Figure 11:
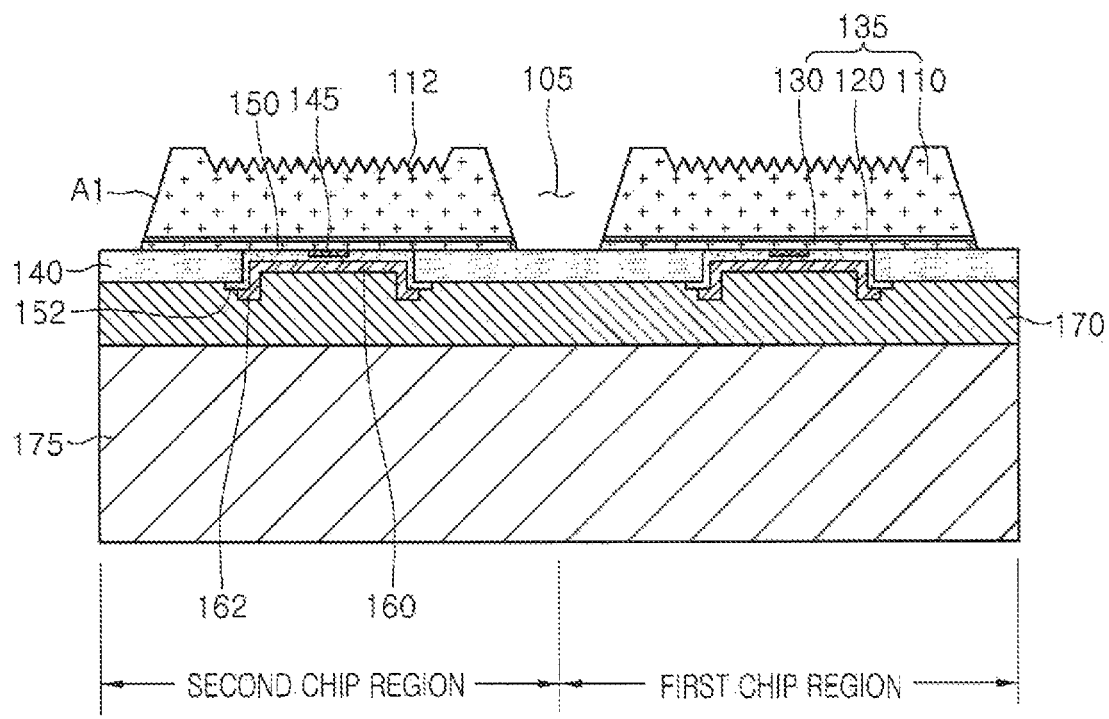

A polishing process based on ICP/RIE (Inductively coupled Plasma/Reactive Ion Etching) may be performed on the surface of the first conductivity type semiconductor layer 110 removed of the substrate 101. Referring to FIGS. 10 and 11, the light-emitting structure 135 of an inter-chip boundary region (for example, a channel region) may be removed through, for example, an isolation etching process. A region 105 removed through the isolation etching process may be etched to expose the channel layer 140 in the chip boundary region; however, embodiments are not limited thereto. A side surface A1 of the light-emitting structure 135 may be inclined.

Thereafter, an etching process may be performed on a top surface of the first conductivity type semiconductor layer 110 to form a roughness pattern 112. The roughness pattern 112 may improve light extraction efficiency.

Figure 12:
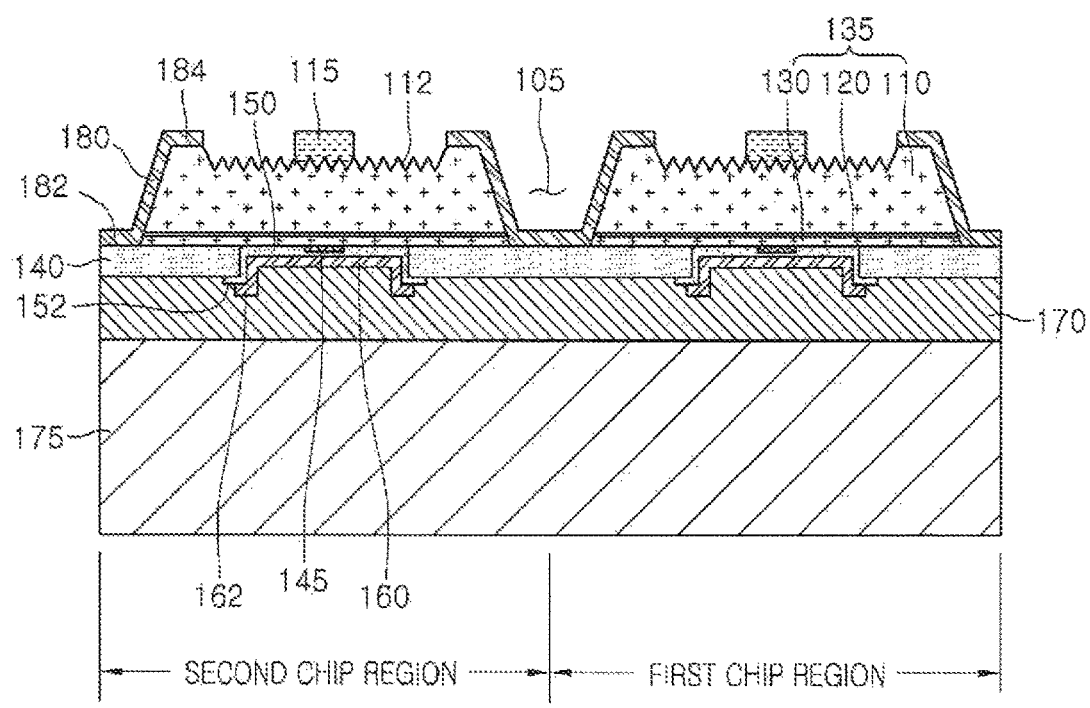
Figure 13:
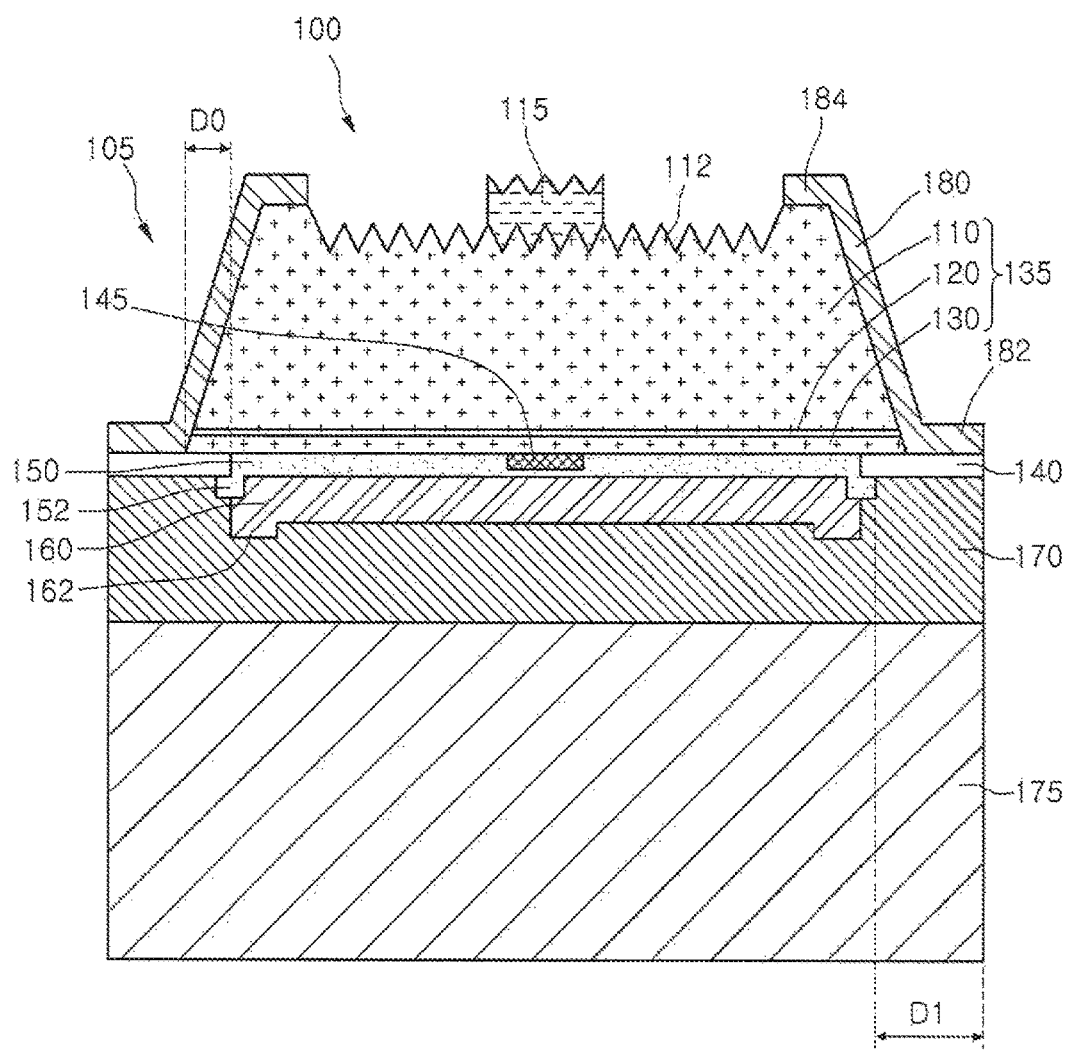

Referring to FIGS. 11 to 13, an insulating layer 180 may be formed around the light-emitting structure 135. The insulating layer 180 may be formed around the chip. That is, a bottom portion 182 may be formed on the channel layer 140 and a top portion 184 formed around the top surface of the first conductivity type semiconductor layer 110. The insulating layer 180 may be formed around the light-emitting structure 135, thus preventing a short between the layers 110, 120 and 130. Also, the insulating layer 180 and the channel layer 140 may prevent moisture from infiltrating into the chip.

An electrode 115 may be formed on the first conductivity type semiconductor layer 110. The electrode 115 may be formed in a predetermined pattern. The forming of the insulating layer 180 and the electrode 115 may be performed before or after chip separation; however, embodiments are not limited thereto. A roughness pattern may be formed in a top surface of the electrode 115; however, embodiments are not limited thereto.

Thereafter, the resulting structure may be separated into separate chip units by a chip boundary. The chip separation may be performed using, for example, a laser or a breaking process.

Figure 14:
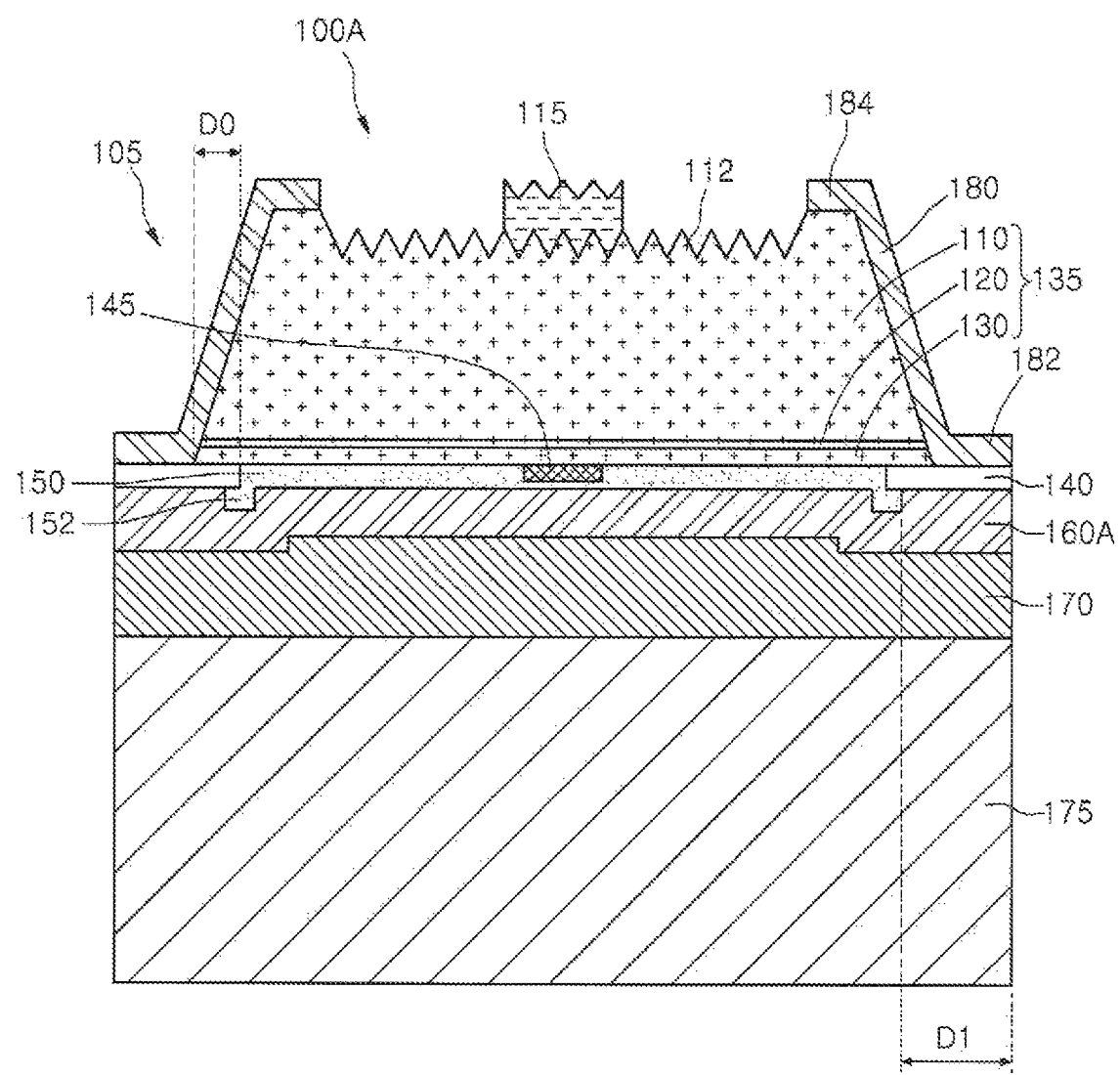
FIG. 14 is a sectional view of a semiconductor light-emitting device according to another embodiment.

FIG. 14 is a sectional view of a semiconductor light-emitting device according to another embodiment. Referring to FIG. 14, a semiconductor light-emitting device 100A may include an electrode layer 160A disposed between a channel layer 140 and an adhesion layer 170. The electrode layer 160A may be formed to have a larger length and/or width than the light-emitting structure 135, thereby improving light reflection efficiency.

Also, the electrode layer 160A may be formed under the ohmic layer 150 and the channel layer 140 and may be exposed outside of the chip. The ohmic layer 150 may be formed to have a smaller length and/or width than the semiconductor layer, and the electrode layer 160A may be formed to have a larger length and/or width than the semiconductor layer. Unlike the previous embodiment this embodiment may extend the electrode layer 160A outside or to an outside edge of the chip, thus improving light reflection efficiency.

Figure 15:
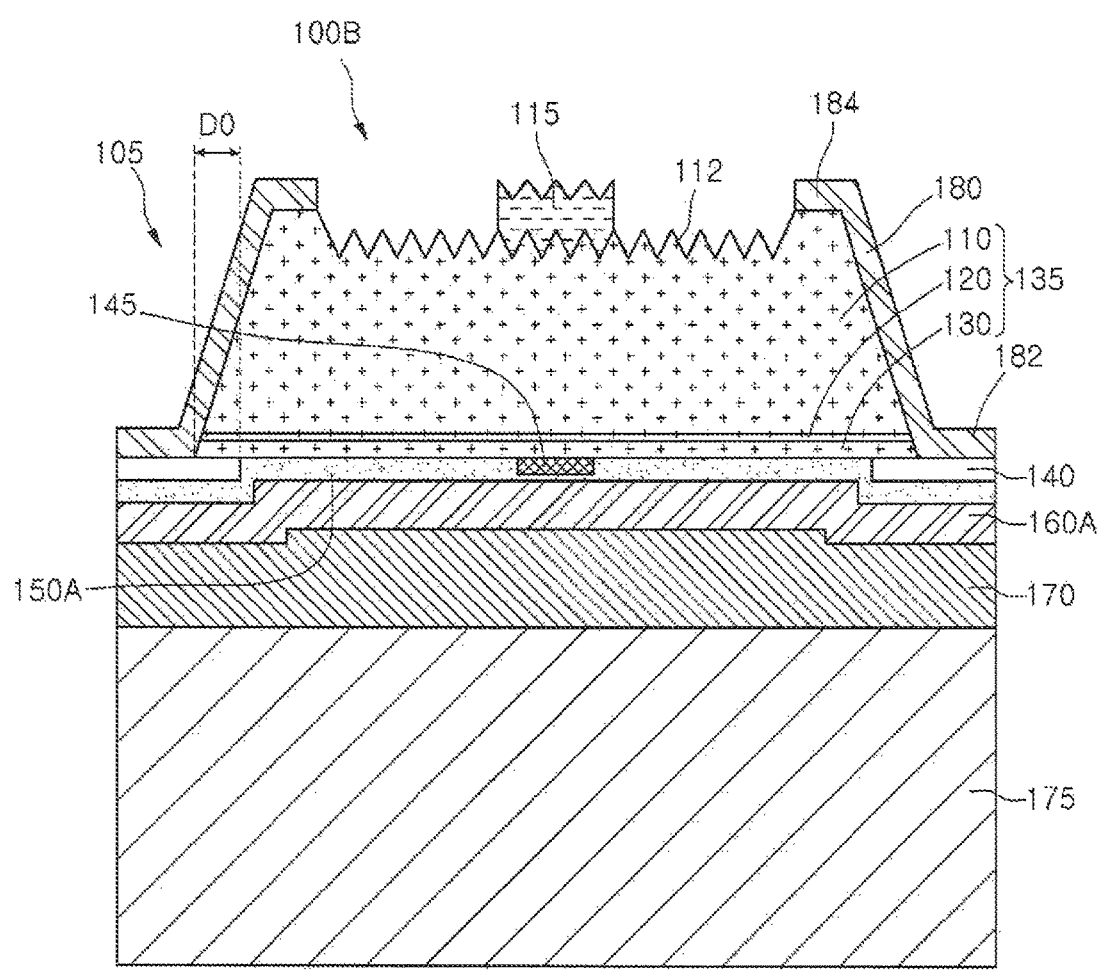
FIG. 15 is a sectional view of a semiconductor light-emitting device according to another embodiment.

FIG. 15 is a sectional view of a semiconductor light-emitting device according to another embodiment. Referring to FIG. 15, a semiconductor light-emitting device 100B may include an ohmic layer 150A, a channel layer 140, an electrode layer 160A, an adhesion layer 170, and a conductive support member 175 that are disposed under the light-emitting structure 135.

The ohmic layer 150A may ohmic-contact a bottom of a second conductivity type semiconductor layer 130 and may extend outside or to an outer edge of the chip. The ohmic layer 150A may extend from the second conductivity type semiconductor layer 130 to a bottom of the channel layer 140.

The ohmic layer 150A may be formed under the electrode layer 160A. Accordingly, the ohmic layer 150A and the electrode layer 160A may be formed in a stack structure under the channel layer 140, and may be exposed outside the chip.

Figure 16:
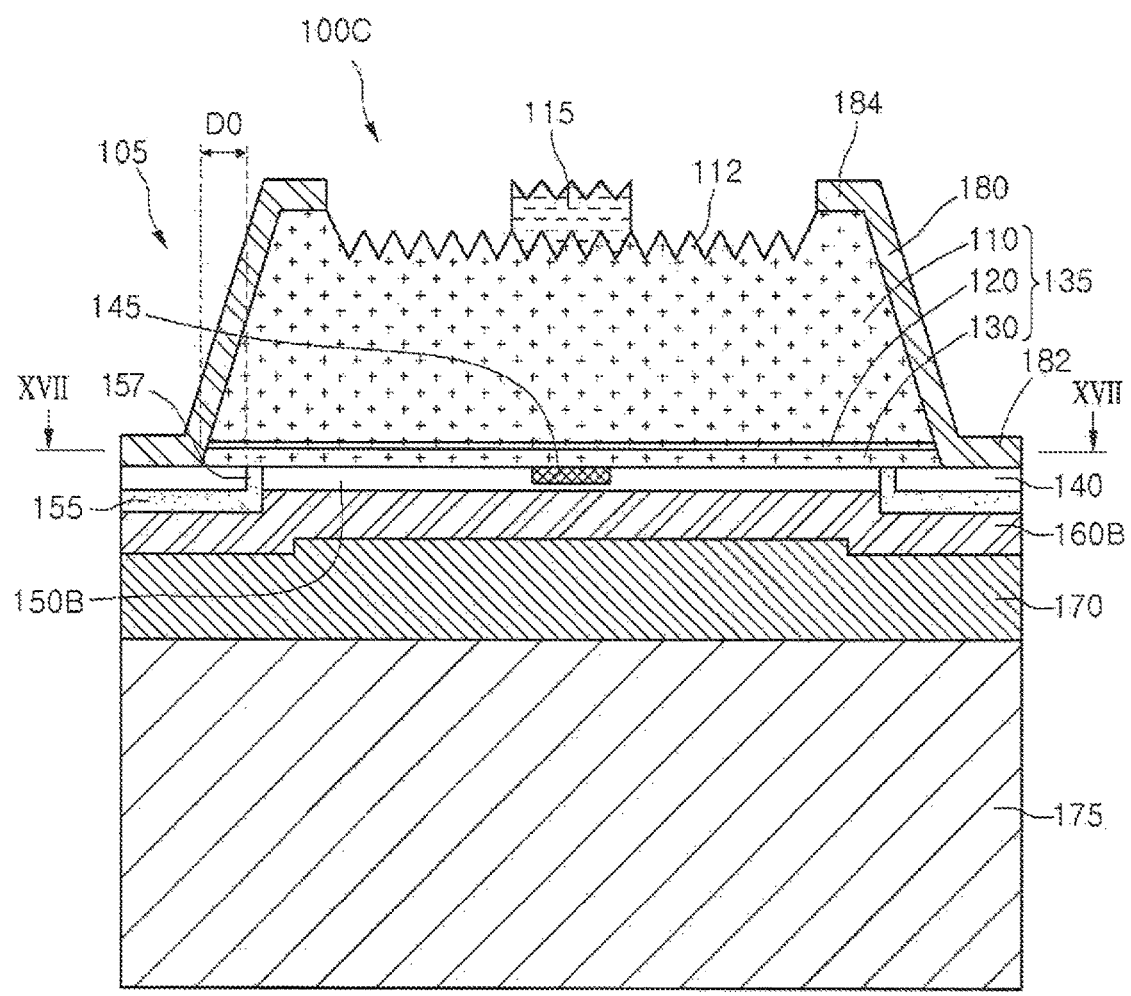
FIG. 16 is a section view of a semiconductor light-emitting device according to another embodiment.
Figure 17:
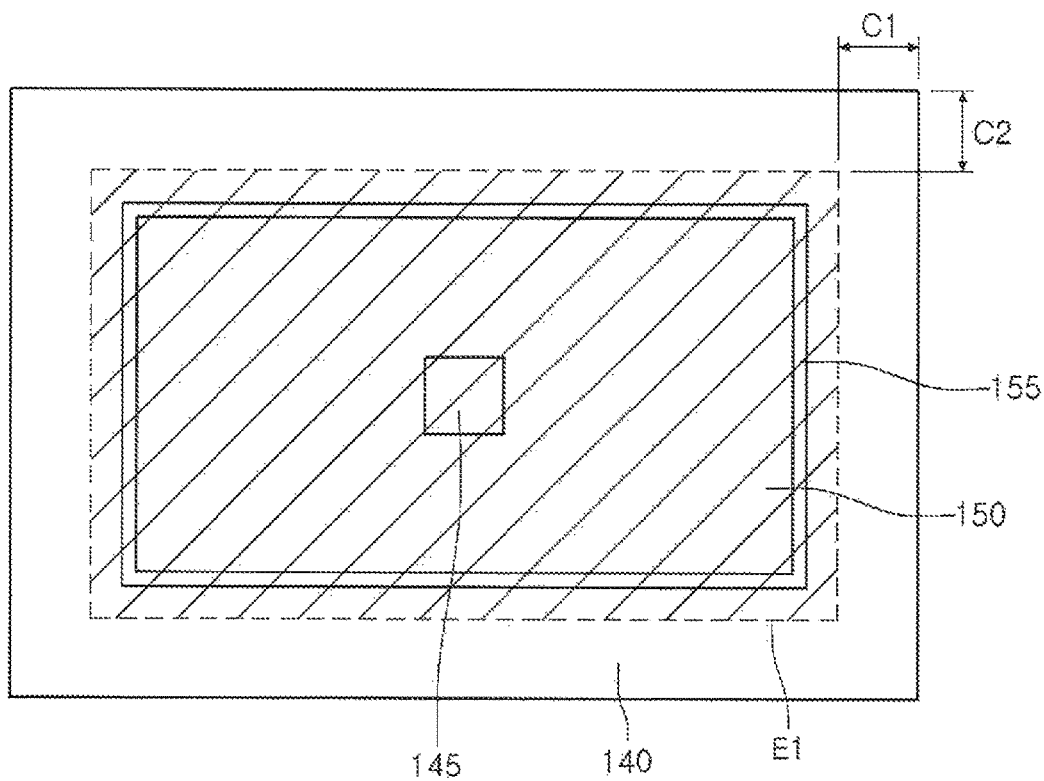
FIG. 17 is a sectional view of the semiconductor light-emitting device of FIG. 16 taken along line XVII-XVII.

FIG. 16 is a sectional view of a semiconductor light-emitting device according to another embodiment. FIG. 17 is a sectional view of the semiconductor light-emitting device of FIG. 16 taken along a line XVII-XVII.

Referring to FIGS. 16 and 17, a semiconductor light-emitting device 100C may include a capping layer 155 disposed between a channel layer 140 and an electrode layer 160B. The capping layer 155 may be formed of a material having a good adhesive force with respect to the material of the channel layer 140, for example, a mixed metal of one or more selected from the group consisting of Ti, Ni, Pt, Pd, Cu, Al, Ir, and Rh. That is, the capping layer 155 may serve as an adhesion layer to improve adhesive force between the metal and the oxide, thus reducing exfoliation outside the chip. The capping layer 155 may be formed between the channel layer 140 and the electrode layer 160B, thus increasing adhesive force to the electrode layer 160B.

Also, an inner end of the capping layer 155 may contact a bottom surface of the second conductivity type semiconductor layer 130 through a space between the channel layer 140 and the ohmic layer 150B. Accordingly, the second conductivity type semiconductor layer 130 may contact the ohmic layer 150B, the channel layer 140, a current blocking layer 145 and the capping layer 155. Therefore, the second conductivity type semiconductor layer 130 may be protected by the channel layer 140 outside the chip, and a current may be provided through the ohmic layer 150B and the capping layer 155 in the chip.

The capping layer 155 may have a higher electrical conductivity than the ohmic layer 150B, thus diffusing current outside the chip. Further, the capping layer 155 may be spaced apart from the ohmic layer 150B, or may be formed to overlap a bottom of the ohmic layer 150B. This modification may be embodied within the technical scope of the inventive concept. Also, the electrode layer 160B and/or the adhesion layer 170 may contact a bottom surface of the capping layer 155.

Referring to FIG. 17, the capping layer 155 may be formed in, for example, a loop, ring, or frame shape along a region between the ohmic layer 150B and, the channel layer 140. An inner end of the capping layer 155 may be formed to have a roughness pattern. In this case, the ohmic layer 150B may alternately contact the channel layer 140B and the capping layer 155.

Figure 18:
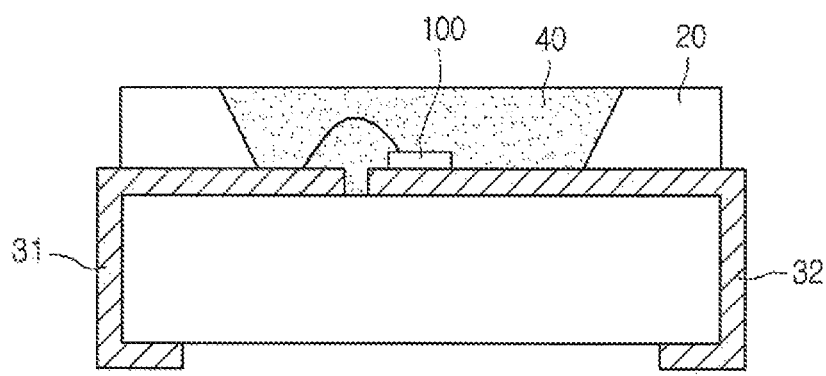
FIG. 18 is a sectional view of a light-emitting device package according to an embodiment.

FIG. 18 is sectional view of a light-emitting device package according to an embodiment. Referring to FIG. 18, a light-emitting device package according to this embodiment includes a body 20, a first lead electrode 31, a second lead electrode 32, a semiconductor light-emitting device 100, and a molding member 40. The first lead electrode 31 and the second lead electrode 32 may be disposed at the body 20. The semiconductor light-emitting device 100 may be electrically connected to the first lead electrode 31 and the second lead electrode 32. The molding member 40 may be configured to mold the semiconductor light-emitting device 100. The body 20 may be formed to include, for example, silicon material, synthetic resin, or metallic material, and an inclined surface may be formed around the semiconductor light-emitting device 100.

The first lead electrode 31 and the second lead electrode 32 may be electrically disconnected from each other, and provide power to the semiconductor light-emitting device 100. Also, the first lead electrode 31 and the second lead electrode 32 may reflect light emitted from the semiconductor light-emitting device 100, thus increasing light efficiency. Also, the first lead electrode 31 and the second lead electrode 32 may serve to discharge heat generated by the semiconductor light-emitting device 100.

The semiconductor light-emitting device 100 may be disposed on the body 20, or may be disposed on the first lead electrode 31 or the second lead electrode 32. The semiconductor light-emitting device 100 may be electrically connected by, for example, a wire to the first lead electrode 31, and may be connected to the second lead electrode 32 in, for example, a die-bonding configuration.

The molding member 40 may mold the semiconductor light-emitting device 100 to protect the semiconductor light-emitting device 100. Also, a fluorescent material may be included in the molding member 40 to change a wavelength of light emitted from the semiconductor light-emitting device 100.

The semiconductor light-emitting device according to embodiments may be packaged, for example, in a semiconductor substrate, a dielectric substrate, or a ceramic substrate (such as resin material or silicon), and may be used, for example, as a light source of a indication device, an illumination device, or a display device. Also, each embodiment is not limited thereto and may be selectively applied to the other embodiments.

As described above, embodiments disclosed herein may improve the light extraction efficiency. Also, embodiments disclosed herein may improve reliability according to junctions between metal and nonmetal layers and between the metal layers under the semiconductor layer. Additionally, embodiments disclosed herein may improve chip reliability.

Embodiments disclosed herein may be applicable to any light-emitting device that provides light.

Embodiments disclosed herein provide a semiconductor light-emitting device capable of improving the adhesive force between layers disposed under a light-emitting structure including a compound semiconductor layer, and a method for fabricating the same.

According to an embodiment disclosed herein, a semiconductor light-emitting device is provided that may include a light-emitting structure including a compound semiconductor layer; an electrode on the light-emitting structure; an ohmic layer under the light-emitting structure; an electrode layer including a reflective metal under the ohmic layer; an adhesion layer under the electrode layer; and a channel layer disposed along a bottom edge of the light-emitting structure.

According to another embodiment disclosed herein, a method for fabricating a semiconductor light-emitting device is provided that may include forming a light-emitting structure including a compound semiconductor layer on a substrate; forming a transparent channel layer along a top edge of the light-emitting structure; forming an ohmic layer on the light-emitting structure; forming an electrode layer including a reflective metal on the ohmic layer; forming an adhesion layer on the electrode layer; removing the substrate; etching the light-emitting structure to expose the channel layer; and forming an electrode on the light-emitting structure.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
   a conductive support member;
   an adhesion layer including a barrier metal layer and a bonding metal layer on the conductive support member;
   an electrode layer having a first multi-layer structure on the adhesion layer;
   an ohmic layer having a second multi-layer structure on the electrode layer;
   a light-emitting structure disposed on the ohmic layer, the light-emitting structure having at least one portion of a bottom surface directly in contact with a first portion of the ohmic layer and an inclined side surface, the light-emitting structure including a first conductivity type semiconductor layer, a second conductivity type semiconductor layer and an active layer disposed between the first conductivity type semiconductor layer and the second conductivity type semiconductor layer;
   a channel layer disposed on the adhesion layer, the channel layer disposed under a plurality of peripheral portions of the bottom surface of the light-emitting structure;
   an insulating layer disposed on an upper surface of the first conductivity type semiconductor layer and the inclined side surface of the light-emitting structure;
   an electrode disposed on an upper surface of the light-emitting structure; and
   a current blocking layer disposed between the adhesion layer and the light-emitting structure, the current blocking layer positioned corresponding to a position of the electrode and including an insulating material, wherein the first conductivity type semiconductor layer comprises a roughness pattern portion and a non-patterned portion on the upper surface thereof, wherein the ohmic layer is spaced apart from an outermost side surface of the adhesion layer and vertically overlapped with the insulating layer, and has a second portion directly contacting the electrode layer, wherein the electrode layer comprises an upper surface, a bottom surface, at least two protrusions that extend from the upper surface or the bottom surface and protrude toward the adhesion layer, and a plurality of extension portions disposed under the bottom surface of the channel layer, each of the upper surface and the bottom surface having a different height from an upper surface of the conductive support member, wherein the bottom surface of the electrode layer is continuously formed from one outermost side surface to the other outermost side surface, wherein the at least two protrusions of the electrode layer are vertically overlapped with a portion of the ohmic layer, and wherein the adhesion layer has a top surface corresponding to the bottom surface of the electrode layer and the top surface of the adhesion layer is in contact with the bottom surface of the electrode layer.

2. The light emitting device according to claim 1, wherein the upper surface of the electrode layer is in contact with both the ohmic layer and the bottom surface of the channel layer, and wherein a material of the upper surface of the electrode layer which is in contact with the ohmic layer is same with that of the upper surface of the electrode layer which is in contact with the bottom surface of the channel layer.

3. The light emitting device according to claim 1, wherein the adhesion layer comprises Au, Sn, and Ti, or composite materials thereof.

4. The light emitting device according to claim 1, wherein the conductive support member comprises at least one of Cu, W or CuW.

5. The light emitting device according to claim 1, wherein the adhesion layer comprises a first surface facing the electrode layer, and a second surface facing the conductive support member, wherein the first surface comprises a recess portion positioned between the at least two protrusions of the electrode layer facing the light-emitting structure, and wherein the second surface comprises a bottom surface positioned corresponding to the conductive support member.

6. The light emitting device according to claim 1, wherein each of the at least two protrusions of the electrode layer is vertically disposed between the current blocking layer and the channel layer.

7. The light emitting device according to claim 1, wherein the one outermost side surface of the electrode layer is aligned with outermost side surfaces of the channel layer or the insulating layer.

8. The light emitting device according to claim 1, wherein the channel layer is in contact with the second conductivity type semiconductor layer and a bottom surface of the insulating layer, and wherein the plurality of extension portions of the electrode layer is disposed lower than the ohmic layer and the channel layer.

9. The light emitting device according to claim 1, wherein the insulating layer and the channel layer respectively comprise a first and a second flat extended portion extended to an outer side of the light-emitting structure and disposed on the adhesion layer.

10. The light emitting device according to claim 9, wherein the insulating layer and the channel layer comprise the same material selected from at least one of $SiO_2$, SiOx, SixOy, $Al_2O_3$, $TiO_2$, $Si_3N_4$, SixNy, SiOxNy, or AlN.

11. The light emitting device according to claim 1, wherein the adhesion layer comprises at least one protrusion protruding toward the light-emitting structure, and wherein the at least one protrusion is disposed between the plurality of extension portions.

12. A light emitting device package, comprising the light emitting device according to claim 1.

13. The light emitting device according to claim 1, wherein the electrode layer is in contact with an internal side surface of the channel layer.

14. The light emitting device according to claim 1, wherein the active layer includes an InGaN well layer and AlGaN barrier layer.

15. A light emitting device, comprising
a conductive support member;
an adhesion layer including a barrier metal layer and a bonding metal layer on the conductive support member;
an electrode layer having a first multi-layer structure on the adhesion layer;
an ohmic layer having a second multi-layer structure on the electrode layer;
a light-emitting structure disposed on the ohmic layer, the light-emitting structure having at least one portion of a bottom surface directly in contact with the ohmic layer and an inclined side surface, the light-emitting structure including a first conductivity type semiconductor layer, a second conductivity type semiconductor layer and an active layer disposed between the first conductivity type semiconductor layer and the second conductivity type semiconductor layer;
a channel layer disposed on the adhesion layer, the channel layer disposed under a plurality of peripheral portions of the bottom surface of the light-emitting structure;
an insulating layer disposed on an upper surface of the first conductivity type semiconductor layer and the inclined side surface of the light-emitting structure;
an electrode disposed on an upper surface of the light-emitting structure; and
a current blocking layer disposed between the adhesion layer and the light-emitting structure, the current blocking layer positioned corresponding to a position of the electrode and including an insulating material, wherein the first conductivity type semiconductor layer comprises a roughness pattern portion and a non-patterned portion on the upper surface thereof, wherein the ohmic layer is spaced apart from an outermost side surface of the adhesion layer and the ohmic layer comprises a first portion vertically overlapped with the insulating layer, and has a portion directly contacting the electrode layer, wherein the electrode layer comprises an upper surface, a bottom surface, at least two protrusions that extend from the upper surface or the bottom surface and protrude toward the adhesion layer, and a plurality of extension portions disposed under the bottom surface of the channel layer and vertically disposed between the current blocking layer and the channel layer, respectively, each of the upper surface and the bottom surface having a different height from an upper surface of the conductive support member, wherein the bottom surface of the electrode layer is continuously formed from one outermost side surface to the other outermost side surface, wherein the at least two protrusions of the electrode layer are vertically overlapped with the ohmic layer, wherein the adhesion layer has a top surface corresponding to the bottom surface of the electrode layer and the top surface of the adhesion layer is in contact with the bottom surface of the electrode layer, wherein the adhesion layer comprises a first surface facing the electrode layer, and a second surface facing the conductive support member, wherein the first surface comprises a recess portion positioned between the at least two protrusions of the electrode layer facing the light-emitting structure, and wherein the second surface comprises a bottom surface positioned corresponding to the conductive support member.

16. The light emitting device according to claim 15, wherein the adhesion layer comprises at least one protrusion protruding toward the light-emitting structure, and wherein the at least one protrusion is disposed between the plurality of extension portions.

17. The light emitting device according to claim 15, wherein the one outermost side surface of the electrode layer is aligned with outermost side surfaces of the channel layer and the insulating layer.

18. The light emitting device according to claim 15, wherein the channel layer is in contact with the second conductivity type semiconductor layer and a bottom surface of the insulating layer, and wherein the plurality of extension portions of the electrode layer are disposed lower than the ohmic layer and the channel layer.

19. The light emitting device according to claim 15, wherein the adhesion layer comprises Au, Sn, and Ti, or composite materials thereof, and wherein the conductive support member comprises at least one of Cu, W or CuW.

* * * * *